(12) United States Patent
Vafai et al.

(10) Patent No.: US 12,598,993 B2
(45) Date of Patent: Apr. 7, 2026

(54) THREE-DIMENSIONAL INTEGRATED CIRCUIT

(71) Applicant: KAMBIX INNOVATIONS, LLC, Albuquerque, NM (US)

(72) Inventors: Kambiz Vafai, Mission Viejo, CA (US); Sainan Lu, Jurupa Valley, CA (US)

(73) Assignee: KV Innovations, LLC, Albuquerque, NM (US)

( * ) Notice: Subject to any disclaimer, the term of this patent is extended or adjusted under 35 U.S.C. 154(b) by 450 days.

(21) Appl. No.: 18/111,427

(22) Filed: Feb. 17, 2023

(65) Prior Publication Data

US 2023/0282548 A1 Sep. 7, 2023

Related U.S. Application Data

(60) Provisional application No. 63/312,210, filed on Feb. 21, 2022.

(51) Int. Cl.
*H01L 23/427* (2006.01)
*H01L 23/00* (2006.01)
*H01L 25/065* (2023.01)

(52) U.S. Cl.
CPC ............ *H01L 23/427* (2013.01); *H01L 24/16* (2013.01); *H01L 24/32* (2013.01); *H01L 24/73* (2013.01); *H01L 25/0657* (2013.01); *H01L 2224/16145* (2013.01); *H01L 2224/16245* (2013.01); *H01L 2224/32145* (2013.01); *H01L 2224/32245* (2013.01); *H01L 2224/73204* (2013.01);
(Continued)

(58) Field of Classification Search
CPC ....... H01L 23/427; H01L 24/16; H01L 24/32; H01L 24/73; H01L 25/0657
See application file for complete search history.

(56) References Cited

U.S. PATENT DOCUMENTS 4,549,036 A 10/1985 Reichbach
8,136,071 B2 3/2012 Solomon
(Continued)

FOREIGN PATENT DOCUMENTS

EP 1628515 B1 9/2007
EP 1827070 B1 10/2017
WO 2009037648 A2 3/2009

OTHER PUBLICATIONS

Santos, C., Vivet, P., Colonna, J.P., Coudrain, P. and Reis, R., Dec. 2014. Thermal performance of 3D ICs: Analysis and alternatives. In 2014 International 3D Systems Integration Conference (3DIC) (pp. 1-7). IEEE.
(Continued)

*Primary Examiner* — Richard A Booth
(74) *Attorney, Agent, or Firm* — Kermit D. Lopez; Luis M. Ortiz

(57) ABSTRACT

A three-dimensional integrated circuit device can include a group of die, a device layer and a thermal interface material formed above the substrate. A heat spreader can be located above the die, the device layer and the thermal interface material. The heat spreader can include a heat pipe comprising a rectangular-shaped heat pipe or disk-shaped heat pipe. A heat sink can be located above the heat spreader. The heat sink can include the heat pipe comprising the rectangular-shaped heat pipe or the disk-shaped heat pipe.

18 Claims, 14 Drawing Sheets

(52) U.S. Cl.
CPC .............. *H01L 2225/06513* (2013.01); *H01L 2225/06517* (2013.01); *H01L 2225/06589* (2013.01); *H01L 2924/1436* (2013.01); *H01L 2924/14511* (2013.01)

(56) References Cited

U.S. PATENT DOCUMENTS

| | | |
|---|---|---|
| 8,172,156 B2 | 5/2012 | Vafai et al. |
| 8,684,274 B2 | 4/2014 | Vafai et al. |
| 9,263,374 B2 | 2/2016 | Masuda et al. |
| 9,472,485 B2 | 10/2016 | Saeidi et al. |
| 9,666,562 B2 | 5/2017 | Law et al. |
| 9,954,080 B2 | 4/2018 | Or-Bach et al. |
| 10,976,789 B2 | 4/2021 | Ghosh |
| 11,018,133 B2 | 5/2021 | Or-Bach et al. |
| 11,037,860 B2 | 6/2021 | Hoffmeyer et al. |
| 11,043,553 B2 | 6/2021 | Kim et al. |
| 2008/0281476 A1 | 11/2008 | Bose et al. |
| 2012/0025388 A1 | 2/2012 | Law et al. |
| 2012/0168128 A1 | 7/2012 | Vafai et al. |
| 2013/0118711 A1 | 5/2013 | Vafai et al. |
| 2015/0010037 A1 | 1/2015 | Vafai et al. |
| 2015/0237762 A1 | 8/2015 | Holt et al. |
| 2021/0043996 A1 | 2/2021 | Menon et al. |
| 2023/0047658 A1 | 2/2023 | Vafai et al. |
| 2023/0048534 A1* | 2/2023 | Vafai ................... H01L 25/0657 |
| 2024/0006269 A1* | 1/2024 | Vafai ................... H01L 25/0657 |
| 2025/0155943 A1* | 5/2025 | Vafai ......................... G06F 1/20 |
| 2025/0157881 A1* | 5/2025 | Vafai ..................... H01L 23/427 |

OTHER PUBLICATIONS

Zhang, Y., Dembla, A., Joshi, Y. and Bakir, M.S., May 2012. 3D stacked microfluidic cooling for high-performance 3D ICs. In 2012 IEEE 62nd Electronic Components and Technology Conference (pp. 1644-1650). IEEE.

Chiang, T.Y., Souri, S.J., Chui, C.O. and Saraswat, K.C., Dec. 2001. Thermal analysis of heterogeneous 3D ICs with various integration scenarios. In International Electron Devices Meeting. Technical Digest (Cat. No. 01CH37224) (pp. 31-32). IEEE.

Tavakkoli, F., Ebrahimi, S., Wang, S. and Vafai, K., 2016. Analysis of critical thermal issues in 3D integrated circuits. International Journal of Heat and Mass Transfer, 97, pp. 337-352.

Tavakkoli, F., Ebrahimi, S., Wang, S. and Vafai, K., 2016. Thermophysical and geometrical effects on the thermal performance and optimization of a three-dimensional integrated circuit. Journal of Heat Transfer, 138(8).

Wang, C., Huang, X.J. and Vafai, K., 2021. Analysis of hotspots and cooling strategy for multilayer three-dimensional integrated circuits. Applied Thermal Engineering, 186, p. 116336.

Xiao, C., He, H., Li, J., Cao, S. and Zhu, W., 2017. An effective and efficient numerical method for thermal management in 3D stacked integrated circuits. Applied Thermal Engineering, 121, pp. 200-209.

Jain, A., Jones, R.E., Chatterjee, R. and Pozder, S., 2009. Analytical and numerical modeling of the thermal performance of three-dimensional integrated circuits. IEEE Transactions on Components and Packaging Technologies, 33(1), pp. 56-63.

Vafai, K. and Wang, W., 1992. Analysis of flow and heat transfer characteristics of an asymmetrical flat plate heat pipe. International journal of heat and mass transfer, 35(9), pp. 2087-2099.

Vafal, K., Zhu, N. and Wang, W., 1995. Analysis of asymmetric disk-shaped and flat-plate heat pipes.

Wang, Y. and Vafai, K., 2000. An experimental investigation of the thermal performance of an asymmetrical flat plate heat pipe. International journal of heat and mass transfer, 43(15), pp. 2657-2668.

Zhu, N. and Vafai, K., 1998. Vapor and liquid flow in an asymmetrical flat plate heat pipe: a three-dimensional analytical and numerical investigation. International Journal of Heat and Mass Transfer, 41(1), pp. 159-174.

Vafai, K. and Zhu, N., 2014. Closure to "Analysis of Asymmetric Disk-Shaped and Flat-Plate Heat Pipes". Journal of Heat Transfer, 136(11).

Wang, C., Tang, S., Liu, X., Su, G.H., Tian, W. and Qiu, S., 2020. Experimental study on heat pipe thermoelectric generator for industrial high temperature waste heat recovery. Applied Thermal Engineering, 175, p. 115299.

Wan, Q. and Galloway, J., Mar. 2011. Accurate Theta JC measurement for high power packages. In 2011 27th Annual IEEE Semiconductor Thermal Measurement and Management Symposium (pp. 208-215). IEEE.

Bar-Cohen, A., Nov. 2009. Thermal management of on-chip hot spots and 3D chip stacks. In 2009 IEEE International Conference on Microwaves, Communications, Antennas and Electronics Systems (pp. 1-8). IEEE.

Schmidt, R., Jan. 2003. Challenges in Electronic Cooling: Opportunities for Enhanced Thermal Management Techniques—Microprocessor Liquid Cooled Minichannel Heat Sink. In International Conference on Nanochannels, Microchannels, and Minichannels (vol. 36673, pp. 951-959).

Koo, J.M., Im, S., Jiang, L. and Goodson, K.E., 2005. Integrated microchannel cooling for three-dimensional electronic circuit architectures. J. Heat Transfer, 127(1), pp. 49-58.

Lau, J.H. and Yue, T.G., May 2009. Thermal management of 3D IC integration with TSV (through silicon via). In 2009 59th Electronic Components and Technology Conference (pp. 635-640). IEEE.

Sridhar, A., Vincenzi, A., Ruggiero, M., Brunschwiler, T. and Atienza, D., Oct. 2010. Compact transient thermal model for 3D ICs with liquid cooling via enhanced heat transfer cavity geometries. In 2010 16th International workshop on thermal investigations of ICs and systems (THERMINIC) (pp. 1-6). IEEE.

Coskun, A.K., Ayala, J.L., Atienza, D., Rosing, T.S. and Leblebici, Y., Apr. 2009. Dynamic thermal management in 3D multicore architectures. In 2009 Design, Automation & Test in Europe Conference & Exhibition (pp. 1410-1415). IEEE.

Zhou, X., Xu, Y., Du, Y., Zhang, Y. and Yang, J., Sep. 2008. Thermal management for 3D processors via task scheduling. In 2008 37th International Conference on Parallel Processing (pp. 115-122). IEEE.

Xing, X.Q., Lee, Y.J., Tee, T.Y., Zhang, X., Gao, S. and Kwon, W.S., Dec. 2011. Thermal modeling and characterization of package with through-silicon-vias (TSV) interposer. In 2011 IEEE 13th Electronics Packaging Technology Conference (pp. 548-553). IEEE.

Lau, J.H., 2012. Recent advances and new trends in nanotechnology and 3D integration for semiconductor industry. ECS Transactions, 44(1), p. 805.

U.S. Appl. No. 17/401,719; List of references, Mar. 15, 2023.

U.S. Appl. No. 17/401,719; Notice of Allowance, Mar. 15, 2023.

* cited by examiner

Tavakkoli et al. (2016)          Present work

Tavakkoli et al. (2016)                    Present work

Vafai & Wang [9]

Present Work

Vafai & Wang [9]

Present Work

1

THREE-DIMENSIONAL INTEGRATED CIRCUIT

CROSS REFERENCE TO PROVISIONAL APPLICATION

This patent application claims priority under 35 U.S.C. § 119 to U.S. Provisional patent application Ser. No. 63/312,210 which was filed on Feb. 21, 2022, and is incorporated by reference herein in its entirety.

TECHNICAL FIELD

Embodiments are related to integrated circuits. Embodiments are also related to the thermal management of integrated circuits. Embodiments further relate to three-dimensional (3D) integrated circuits. Embodiments additionally relate to heat pipes and in particular flat-shaped heat pipes. Embodiments further relate to methods, systems and devices that improve the thermal performance of 3D integrated circuits utilizing rectangular-shaped and/or disk-shaped heat pipes.

BACKGROUND

Moore's law has been applicable for many of the advancements in modern electronics. The issue of coming up against proper thermal management, however, prevents electrical devices and electrical components from being produced in much smaller scales. Hence, the industry has moved from a two-dimensional approach to a three-dimensional set-up to utilize the volume more efficiently. A three-dimensional integrated circuit (3D IC) is a metal-oxide semiconductor integrated circuit manufactured by stacking silicon wafers or dies and interconnecting them vertically using through-silicon vias (TSVs), such that they behave as a single integrated device to achieve higher performance, lower power consumption, higher functional density, lower transistor packaging density, and a smaller formfactor than conventional two-dimensional integrated circuits.

Despite all these benefits, heat built up within the stacks must be removed. 3D ICs pack an extraordinary amount of complexity into an extremely small space, which creates a substantial amount of heat, resulting in damage to the device's reliability. Thermal hotspots in 3D ICs can exacerbate failure mechanisms such as junction leakage and electromigration, resulting in degradation of the device's performance. It is increasingly important to have effective and efficient thermal management in order to optimize the design characteristics of 3D ICs. Discussions regarding this topic have dominated research in recent years. Santos et al., for example, has demonstrated that non-thinned stacked dies may act as heat spreaders to alleviate hotspot issues. It was also proposed in that study that graphite-based heat spreaders can be used as an alternative to compensate the poor heat dissipation exhibited in 3D ICs [1].

Zhang et al. [2] concluded that the embedded microfluidic cooling shows significant junction temperature reduction compared to air-cooling by evaluating the hotspot temperature of different architectures of 3D ICs experimentally. Chiang et al. [3] discussed the thermal performance with various integration schemes of 3D ICs and showed that the effects of vias are crucial in analyzing the thermal performance. Tavakkoli et al. [4, 5] performed a comprehensive thermal analysis of 3D high performance chips using numerical simulations. The effect of parametric changes in the geometrical configuration on the temperature distribution and hotspot temperature were extensively highlighted, such as size, number and spacing, TSV arrangements (nominal TSVs, uniform TSVs and core-concentrated TSVs). The investigation also sufficiently outlined the impact of the thermophysical properties of the chip and cooling fluid on the flow and heat transfer. Their results presented the key features to be used for establishing optimized design and setup of 3D ICs. And it was established that a core-concentrated TSV arrangement is the foremost emplacement of the optimized TSV arrangement in varied cases.

Wang, C., Huang, X. J., & Vafai, K. (2021) [6] performed the heat transfer computational fluid dynamic analysis to study the effects of geometric and thermal properties of multilayer nominal 3D IC chips on the temperature hotspots with different distributions of processors (overlapped cores and staggered cores). They found that the larger the number of the chip layers, the higher the hotspot temperature is; but having a large Reynolds number can help decrease the hotspot temperature. And with core-concentrated thermal TSVs, the staggered cores have better thermal performance at a lower number of layers (2-8) while the overlapped core structure performed better at a higher number of layers (10-18) [6]. Xiao et al. [7] performed the FEA and 3D CFD analysis under a natural convection environment on the thermal performance of 3D stacked ICs and proposed a fast and accurate approach to estimate equivalent thermal conductivity of interposer with various TSV parameters. They advocated that a smaller TSV diameter and $SiO_2$ thickness and a greater TSV pitch will increase the equivalent thermal conductivity in the x-y direction but a smaller TSV pitch and SiO2 thickness and a larger TSV diameter will raise the equivalent thermal conductivity in the z direction. It was also mentioned that the maximum junction temperature difference between each layer of stacked chips is negligible for the uniform heat source setting, while the thinner chip would result in noticeable hot spots [7]. However, this conclusion is based on 3D ICs without heat sinks. With heat sinks, the device layer that is farthest from heat sink is exposed to a higher temperature compared to the device layer that is closer to the heat sinks [4].

Jain et al. [8] developed analytical and finite-element models of heat transfer in stacked 3D ICs to investigate the impact of various geometric parameters and thermophysical properties on the thermal performance. This investigation established that package and heat sink thermal resistances play a more important role in determining the rise in temperature compared to inter-die bond thermal resistances.

Heat sinks are essentially heat dissipation devices for removing heat from a heat source, such as processors and GPUs, to keep the source at a proper operating temperature. Heat sinks are crucial in optimizing the thermal performance of 3D ICs. Heat pipes can be excellent heat sinks and have been contributing to the thermal management in existing integrated circuit technology. A heat pipe is a vacuum sealed metal tube that contains a working fluid that changes from liquid to vapor when heat is applied to one end of the tube. The heated vapor moves quickly to the other end of the tube where it condenses then travels through the wick material (sintered copper) back to the heat source section. This design allows heat pipes to transfer heat much more efficiently than a solid piece of metal with the added benefits of being much lighter weight and performing well in any orientation.

It has been well established in many applications, such as spacecraft thermal controls, electronic systems cooling and many commercial thermal devices. However, the traditional heat pipes have some limitations; for instance, they only transfer heat in one direction and the round shape makes it physically difficult to get close to a very small heat source. Vafai et al. [9-13] had established and analyzed comprehensively flat-shaped heat pipes that can overcome the limitations of the traditional heat pipes. The flat-shaped heat pipes offer an effective solution for the high heat generation of 3D ICs and have far-reaching impact on the thermal management of 3D ICs with unrivaled advantages, such as a secondary feeding mechanism, substantially better geometric adoptability for complex applications and ability to fully handle the asymmetrical heat load.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved integrated circuit.

It is another aspect of the disclosed embodiments to provide the thermal management of integrated circuits.

It is a further aspect of the embodiments to provide for an improved 3D integrated circuit.

It is also an aspect of the embodiments to provide for utilization of a flat-shaped heat pipe as a thermal management strategy for a 3D integrated circuit and other devices.

It is a further aspect of the embodiments to provide for an innovative rectangular-shaped or disk-shaped heat pipe as a heat sink for 3D integrated circuits.

It is also an aspect of the embodiments to provide for an innovative method, apparatus and system that uses a flat-shaped heat pipe as a heat spreader and a heat sink in a single 3D IC structure.

The aforementioned aspects and other objectives and advantages can now be achieved as described herein. In an embodiment, a 3D integrated circuit device, can include: a substrate; a plurality of die, a device layer and a thermal interface material formed above the substrate; a heat spreader located above the plurality of die, the device layer and the thermal interface material, the heat spreader comprising a heat pipe comprising a rectangular-shaped heat pipe or disk-shaped heat pipe; and a heat sink located above the heat spreader, the heat sink comprising the heat pipe comprising the rectangular-shaped heat pipe or the disk-shaped heat pipe.

In an embodiment, a 3D integrated circuit device can include a substrate; a thermal interface material layer; a plurality of die, a device layer and a micro-bump thermal interface material layer formed above thermal interface material layer; a heat spreader located above the plurality of die, the device layer and the thermal interface material, the heat spreader comprising a heat pipe comprising a rectangular-shaped heat pipe or disk-shaped heat pipe; and a heat sink located above the heat spreader, the heat sink comprising the heat pipe comprising the rectangular-shaped heat pipe or the disk-shaped heat pipe. In an embodiment, the thermal interface layer can comprise a C4 bump (or C4 bumps).

In an embodiment, a 3D integrated circuit device, can include a substrate; a thermal interface material layer comprising C4 bumps; a plurality of die, a device layer and a micro-bump thermal interface material layer formed above the C4-bump thermal interface material layer; a heat spreader located above the plurality of die, the device layer and the thermal interface material, the heat spreader comprising a heat pipe comprising a rectangular-shaped heat pipe or disk-shaped heat pipe; and a heat sink located above the heat spreader, the heat sink comprising the heat pipe comprising the rectangular-shaped heat pipe or the disk-shaped heat pipe.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
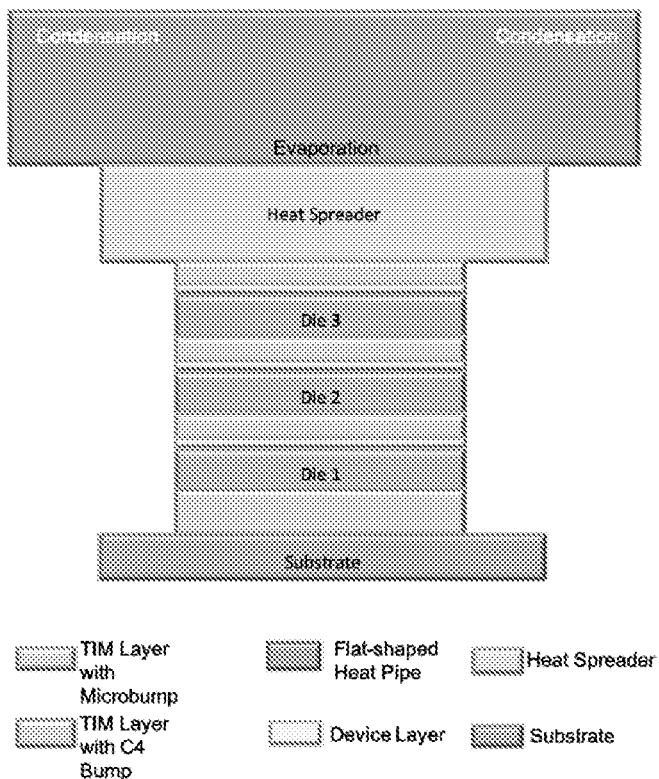
FIG. 1 illustrates a schematic diagram of the structure of a three-dimensional IC, in accordance with an embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part. In addition, identical reference numerals utilized herein with respect to the drawings can refer to identical or similar parts or components.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Rectangular-shaped and disk-shaped heat pipes, as innovative heat sinks, can be used to optimize the thermal performance of three-dimensional integrated circuits (3D ICs). Finite volume numerical analysis can be employed to carry out the simulation of the thermal performance of 3D ICs. Both rectangular-shaped and disk-shaped heat pipes can substantially improve the overall thermal performance and reduce the hotspot temperatures by, for example, 7 K and 11 K on average, respectively. Furthermore, utilizing the rectangular-shaped or the disk-shaped heat pipe embodiments as a heat spreader in place of a solid copper heat spreader can further optimize the thermal performance by reduction of the junction temperatures, for example, 14 K and 16 K on average, respectively. These reductions can be achieved while the weight of the set-up can be also significantly reduced. The results indicate that the disclosed innovative flat-shaped heat pipes can significantly optimize the thermal performance of 3D ICs. The model and results discussed herein aim to pave the way to markedly alleviate the thermal issues of 3D ICs.

The embodiments relate to the utilization of flat-shaped heat pipes as heat sinks and heat spreaders on the thermal performance of 3D ICs with a core-concentrated TSVs arrangement. A significant effect of flat-shaped heat pipes on the reduction of junction temperature and the overall thermal performance of the 3D IC structure may be improved through implementation of the embodiments.

FIG. 1 illustrates a schematic diagram of the structure of a three-dimensional IC, in accordance with an embodiment. The schematic of the nominal 3D IC structure is shown in FIG. 1 as shown in Tavakkoli et al. [4, 5]. As can be seen, the 3D IC structure incorporates a substrate, a thermal interface material (TIM) layer with C4 bumps, three layers of dies, device layers and thermal interface materials with microbumps, a heat spreader and a flat-shaped heat pipe as the heat sink. Device layers, bonded between TIM with microbumps and die, comprises four processors which are the main heat. Table 1 displays the nominal values for different components of the 3D IC structure, including materials, length and width, and thickness.

The nominal heat dissipation (30 W each layer) produced by the transistors in the processors, are conducted through the layers to the substrate downward and to the heat spreader, and subsequently dissipated to the heat sink upward and eventually to the ambient air through convective heat transfer. Conductive heat transfer through the solid, and isotropic layers of the 3D IC are governed by:

$$\frac{\partial^2 \Theta_s^+}{\partial x^{+2}} + \frac{\partial^2 \Theta_s^+}{\partial y^{+2}} + \frac{\partial^2 \Theta_s^+}{\partial z^{+2}} + q_g^+ = 0 \tag{1}$$

Where $q_g^+$ denotes the dimensionless volumetric heat generation in the central processing units and the nondimensionalized temperature and coordinates are set up as:

$$x^+ = \frac{x}{h},$$

$$y^+ = \frac{y}{h},$$

$$z^+ = \frac{z}{h},$$

$$\Theta^+ = \frac{T - T_e}{qh/k_f}$$

The natural convective heat transfer is replayed at the bottom surface of the substrate, whereas the forced convection is administered at the top surface of the flat-shaped heat pipes. The convective boundary conditions are:

$$\frac{\partial \Theta_s^+}{\partial n} = -Bi \cdot \Theta_s^+ \tag{2}$$

Where n is the normal coordinate and Bi is the dimensionless Biot number.

The heat transfer and fluid flow are based on the Navier-stokes equations. The cooling fluid enters into the 3D IC package at ambient temperature with a specified Reynolds number and exits the package at atmospheric pressure with negligible streamwise temperature change. The dimensionless Navier-Stokes equations in Cartesian coordinates are:

Mass Conservation:

$$\frac{\partial u^+}{\partial x^+} + \frac{\partial v^+}{\partial y^+} + \frac{\partial w^+}{\partial z^+} = 0 \tag{3}$$

x-Momentum Equation:

$$Re_h \left( u^+ \frac{\partial u^+}{\partial x^+} + v^+ \frac{\partial u^+}{\partial y^+} + w^+ \frac{\partial u^+}{\partial z^+} \right) = -\frac{\partial p^+}{\partial x^+} + \left( \frac{\partial^2 u^+}{\partial x^{+2}} + \frac{\partial^2 u^+}{\partial y^{+2}} + \frac{\partial^2 u^+}{\partial z^{+2}} \right) \tag{4}$$

y-Momentum Equation:

$$Re_h \left( u^+ \frac{\partial v^+}{\partial x^+} + v^+ \frac{\partial v^+}{\partial y^+} + w^+ \frac{\partial v^+}{\partial z^+} \right) = -\frac{\partial p^+}{\partial y^+} + \left( \frac{\partial^2 v^+}{\partial x^{+2}} + \frac{\partial^2 v^+}{\partial y^{+2}} + \frac{\partial^2 v^+}{\partial z^{+2}} \right) \tag{5}$$

z-Momentum Equation:

$$Re_h \left( u^+ \frac{\partial w^+}{\partial x^+} + v^+ \frac{\partial w^+}{\partial y^+} + w^+ \frac{\partial w^+}{\partial z^+} \right) = -\frac{\partial p^+}{\partial z^+} + \left( \frac{\partial^2 w^+}{\partial x^{+2}} + \frac{\partial^2 w^+}{\partial y^{+2}} + \frac{\partial^2 w^+}{\partial z^{+2}} \right) \tag{6}$$

Energy Conservation for the Fluid Domain:

$$Pe_h \left( u^+ \frac{\partial \Theta_f^+}{\partial x^+} + v^+ \frac{\partial \Theta_f^+}{\partial y^+} + w^+ \frac{\partial \Theta_f^+}{\partial z^+} \right) = \frac{\partial^2 \Theta_f^+}{\partial x^{+2}} + \frac{\partial^2 \Theta_f^+}{\partial y^{+2}} + \frac{\partial^2 \Theta_f^+}{\partial z^{+2}} \tag{7}$$

The Nondimensionalized Terms in the Above Equations are:

$$u^+ = \frac{u}{u_m}, v^+ = \frac{v}{v_m}, w^+ = \frac{w}{w_m}, p^+ = \frac{ph}{\mu_f u_m},$$

$$Re_h = \frac{\rho_f u_m h}{\mu_f}, Pe_h = \frac{\rho_f c_{p,f} u_m h}{k_f}$$

Figure 2:
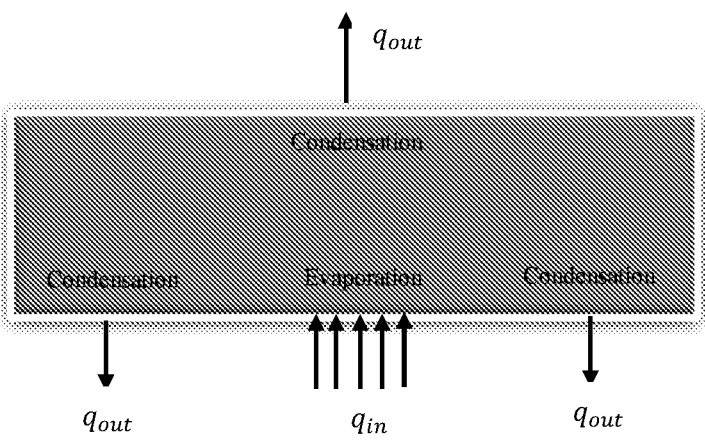
FIG. 2 illustrates a cross-sectional view of a rectangular-shaped or disk-shaped heat pipe, in accordance with an embodiment.

FIG. 2 illustrates a cross-sectional view of a heat pipe, in accordance with an embodiment. The design and set up of a rectangular-shaped or disk-shaped heat pipe in previous works of Vafai et al. [9-13] are deployed in this work. The cross section view of the heat pipe is displayed as FIG. 2. The assumptions made in this model are: (1) Vapor and liquid flow are steady, laminar and subsonic. (2) Transport properties for the vapor and liquid are taken as constant. (3) The vapor injection and suction rate are uniform in the evaporator and condenser sections. (4) The vapor velocity component in the z direction is negligible since there is no injection or suction on vertical wicks.

The analytical solution for the vapor pressure distribution, liquid pressure distribution and temperature distribution for the rectangular-shaped heat pipe and disk-shaped heat pipe are documented in Vafai et al. [9-13]. Based on the analysis given in these works, we can obtain the rectangular and disk-shaped vapor and liquid pressure and temperature distributions, as given in eqs. (8) to (14) which are used to validate our model.

Rectangular-Shaped Heat Pipe's Vapor Pressure Distribution $$\Delta p_v^+(x^+) = \begin{cases} -\frac{4(1-\varphi)}{(2-\varphi)} Re_h \left\{ \left[ \frac{16(1-\varphi)}{25\varphi} Re_h + \frac{1}{2(h_b^+)^2} \right] (x^+)^2 + \int_0^{x^+} \frac{x^+}{f^+(x^+)(1-f^+(x^+))} dx^+ \right\} \\ \qquad (0 \leq x^+ \leq \varphi l^+) \\ \Delta p(\varphi l^+) - \frac{4\varphi}{(2-\varphi)} Re_h \left\{ \left[ \frac{16\varphi}{25(2-\varphi)} Re_h - \frac{1}{2(h_b^+)^2} \right] [(x^+ - l^+)^2 - (\varphi l^+ - l^+)^2] - \int_0^{x^+} \frac{x^+ - l^+}{f^+(x^+)(1-f^+(x^+))} dx^+ \right\} \\ \qquad (\varphi l^+ \leq x^+ \leq l^+) \end{cases} \tag{8}$$

Where $f^+(x^+)$ can be found from:

$$\frac{df^+(x^+)}{dx^+} = \begin{cases} \left[ -\frac{9}{2}(1-\varphi)f^+(x^+) + 5\frac{(2-\varphi)}{Re_h} \frac{1}{f^+(x^+)} - \frac{5}{2}\varphi \right] \frac{1}{(1-\varphi)x^+} \\ \qquad (0 \leq x^+ \leq \varphi l^+) \\ \left[ -\varphi f^+(x^+) + 10\frac{(2-\varphi)}{Re_h} \frac{1}{f^+(x^+)} \right] \frac{1}{7\varphi(l^+ - x^+)} \\ \qquad (\varphi l^+ \leq x^+ \leq l^+) \end{cases} \tag{9}$$

Rectangular-Shaped Heat Pipe's Liquid Pressure Distribution $$\Delta p_l^+(x^+) = \begin{cases} \Delta p_v^+(l^+) - \frac{h_w^+ \mu^+ (1-\varphi)Re_h}{2(2-\varphi)K^+} \left\{ \varphi(1-\varphi)(l^+)^2 + [(\varphi l^+)^2 - (x^+)^2] \right\} \\ \qquad (0 \leq x^+ \leq \varphi l^+) \\ \Delta p_v^+(l^+) - \frac{h_w^+ \mu^+ \varphi Re_h}{2(2-\varphi)K^+} (l^+ - x^+)^2 \quad (\varphi l^+ \leq x^+ \leq l^+) \end{cases} \tag{10}$$

Rectangular-Shaped Heat Pipe's Temperature Distribution $$\Delta T_v^+(x^+) = (T_{ov}^+)^2 \left[ \frac{\ln p_v^{+2}(x^+) - \ln p_{ov}^+}{1 - T_{ov}^+ (\ln p_{ov}^+ - \ln p_v^+(x^+))} \right] \tag{11}$$

Disk-Shaped Heat Pipe's Vapor Pressure Distribution $$p_v^+(r^+) = \begin{cases} p_v^+(0) - \dfrac{24}{25}\left(\dfrac{1-\varphi^2}{2-\varphi^2}Re_hR^+\right)^2\left(\dfrac{r^+}{R^+}\right)^2 & (0 \le r^+ \le \varphi R^+) \\ p_v^+(0) - \dfrac{8}{25}\left(\dfrac{\varphi^2}{2-\varphi^2}Re_hR^+\right)^2\left[3\left(\dfrac{r^+}{R^+}\right)^2 + \left(\dfrac{R^+}{r^+}\right)^2 \\ \quad -4\ln\dfrac{r^+}{R^+} - 2\left(3 - 2\ln\varphi - \dfrac{1}{\varphi^2}\right)\right] & (\varphi R^+ \le r^+ \le R^+) \end{cases} \quad (12)$$

Disk-Shaped Heat Pipe's Liquid Pressure Distribution $$p_l^+(r^+) = \begin{cases} p_v^+(0) + \dfrac{v^+ Re_h(R^+)^2}{4K^+(h_w^+)^3}\dfrac{1-\varphi^2}{2-\varphi^2}\left[\left(\dfrac{r^+}{R^+}\right)^2 + \dfrac{2\varphi^2}{2-\varphi^2}\ln\varphi\right] - \\ \quad \left(\dfrac{4}{5}\dfrac{\varphi^2 Re_h}{2-\varphi^2}R^+\right)^2\left(2\ln\varphi + \dfrac{1}{\varphi^2-1}\right) & (0 \le r^+ \le \varphi R^+) \\ p_v^+(0) + \dfrac{v^+ Re_h(R^+)^2}{4K^+(h_w^+)^3}\dfrac{\varphi^2}{2-\varphi^2}\left[1 - \left(\dfrac{r^+}{R^+}\right)^2 - 2\ln\left(\dfrac{R^+}{r^+}\right)\right] - \\ \quad \left(\dfrac{4}{5}\dfrac{\varphi^2 Re_h}{2-\varphi^2}R^+\right)^2\left(2\ln\varphi + \dfrac{1}{\varphi^2} - 1\right) & (\varphi R^+ \le r^+ \le R^+) \end{cases} \quad (13)$$

Disk-Shaped Heat Pipe's Temperature Distribution $$\Delta T_v^+(r^+) = (T_{ov}^+)^2\left[\dfrac{\ln p_v^+(r^+) - \ln p_{ov}^+}{1 - T_{ov}^+(\ln p_{ov}^+ - \ln p_v^+(r^+))}\right] \quad (14)$$

Once the vapor pressure distribution is found, the vapor temperature distribution within the heat pipe can be obtained from equations (11) and (14). The temperature difference across the heat pipe may be employed to calculate the effective thermal conductivity of the rectangular-shaped heat pipe and disk-shaped heat pipe with the Eqs. (15) and (16) [14].

$$k_{eff} = \dfrac{QL_{eff}}{A\Delta T} \quad (15)$$

$$L_{eff} = \dfrac{L_{evaporator} + L_{condenser}}{2} + L_{adiabatic} \quad (16)$$

Where $k_{eff}$ is the effective thermal conductivity; Q is the power transported; $L_{eff}$ is the effective length; A is the cross-sectional area; $\Delta T$ is the temperature difference between evaporator and condenser sections. In this study, the evaporator section is on the bottom surface of the heat pipe and the rest of the heat pipe's external area acts as the condenser section [9]. Once the effective thermal conductivity is obtained, the heat pipe employed for the 3D IC structure will be modeled as a solid flat plate in the system. It should be noted that the rectangular shaped and disk-shaped heat pipes not only possess the extraordinary heat transfer capacity and rate, but also lighter in weight when compared to solid copper of the same size. This makes their use even more appealing. The nominal dimension of the heat pipe is 50×50×29.4 mm³ in this investigation, in which the total height of the wick structure is 4 mm. The rest of the volume is a vapor channel, which is negligible in weight. Compared to the same sized solid copper plate, the weight of the heat pipe is over 7 times lighter.

Figure 3:
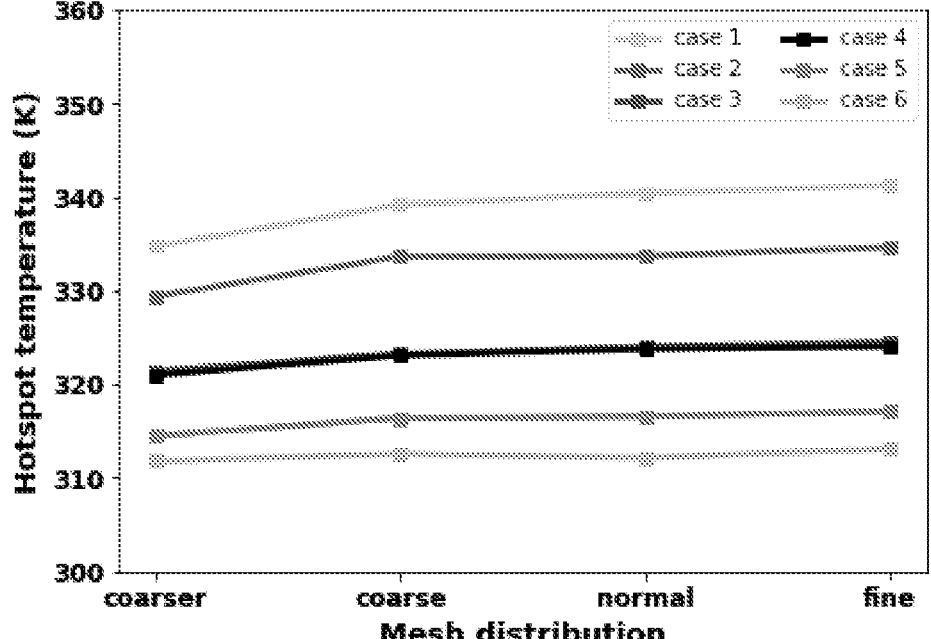
FIG. 3 illustrates a graph depicting data resulting from a grid independence study for the investigated geometries, in accordance with an embodiment.

COMSOL Multiphysics can be utilized to set up the simulations. For model validation, a grid independence study was executed for all investigated geometries and the junction temperature for each geometry was evaluated using computational meshes for different cell distributions. FIG. 3 presents the grid independence study for the nominal cases applying customized coarser, coarse, normal and fine mesh distributions. It can be concluded that there is no advantage to further increasing the number of grid cells after coarse mesh distribution. The last refined mesh gives a relative difference of %0.02 for the hotspot temperature in comparison with the prior mesh. To minimize the computational cost while maintaining the accuracy of the simulation, the coarse mesh distribution is applied in this study.

To ratify the model, the temperature distribution of the 3D IC is validated with both the previous simulation work [4] and the experimental results [2]. The vapor pressure distribution, liquid pressure distribution and temperature distribution within the rectangular-shaped heat pipe is compared with the comprehensive analytical solution of Vafai and Wang [9].

Figure 4:
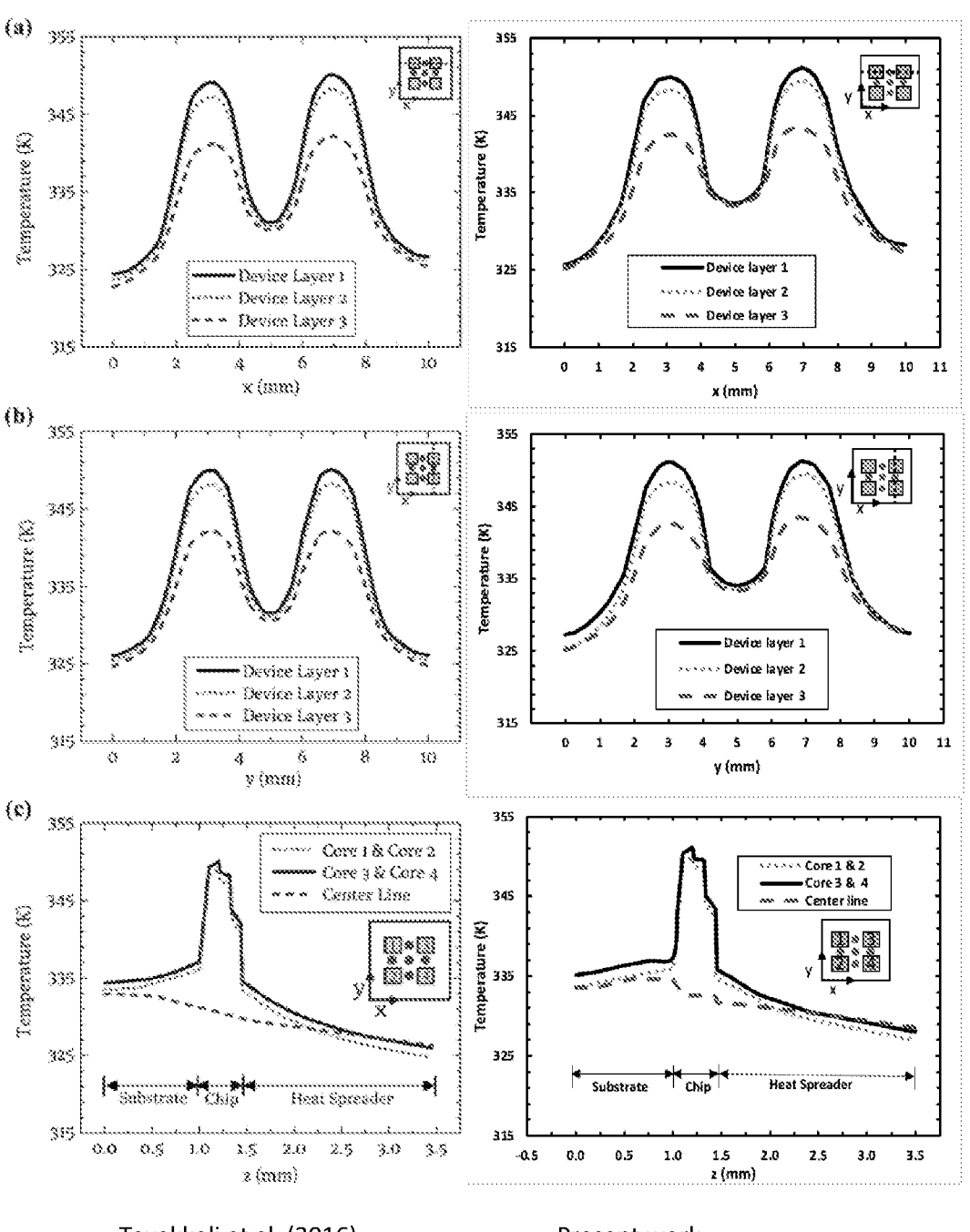
FIG. 4 illustrates a graph depicting data indicative of a comparison of the temperature distribution for the nominal benchmark 3D IC with Tavakkoli et al. [4,5] (a) along the x direction for each device layer (b) along the y direction for each device layer (c) along the z direction at the vertical center line of each core and the center line of chip, in accordance with an embodiment.
Figure 5:
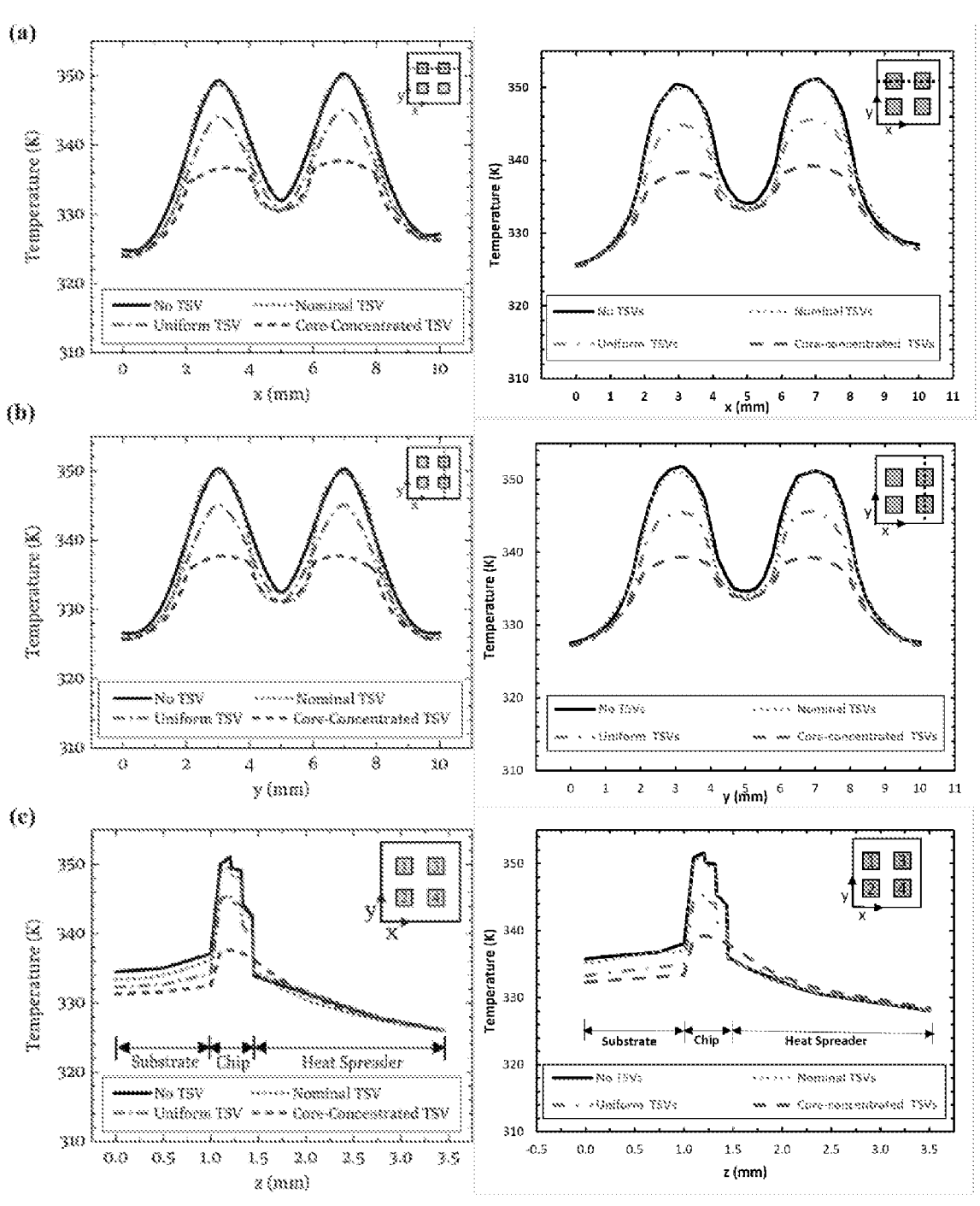
FIG. 5 illustrates a graph depicting data indicative of a comparison of the effects of different TSV arrangement on the temperature distribution of the 3D IC structure with Tavakkoli et al. [4, 5] (a) along the x direction in device layer 1 (b) along the y direction in device layer 1 (c) along the z direction at vertical center line of the core processor 3, in accordance with an embodiment.

FIG. 4 illustrates the resemblance of the temperature distribution for the nominal benchmark 3D IC along the x, y, and z directions for each device layer between the work of Tavakkoli et al. [4] and the present work. FIG. 5 displays the comparison of the effect of different TSV arrangements on the temperature distribution of the 3D IC structure along the x, y and z directions in the device layer 1. It should be recognized that the z direction is at the vertical center line of the core processor 3. The comparisons between these two works show very good agreement.

Figure 6:
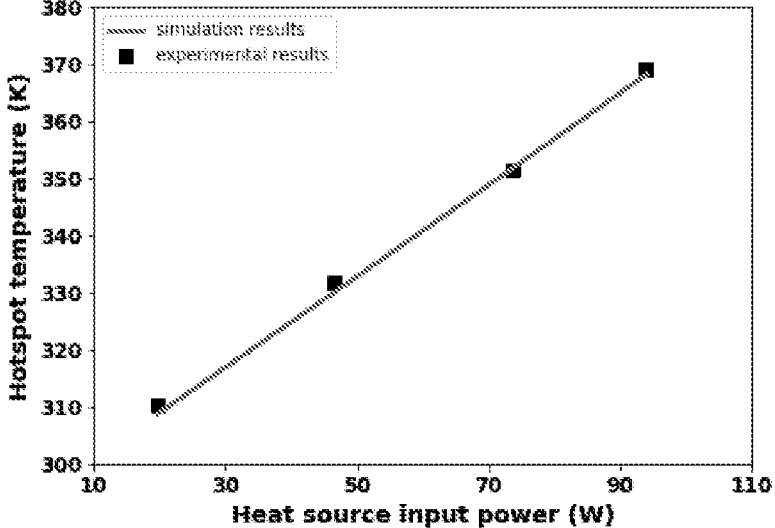
FIG. 6 illustrates a graph depicting data indicative of a comparison of the hotspot temperature with the experimental results, in accordance with an embodiment.
Figure 7:
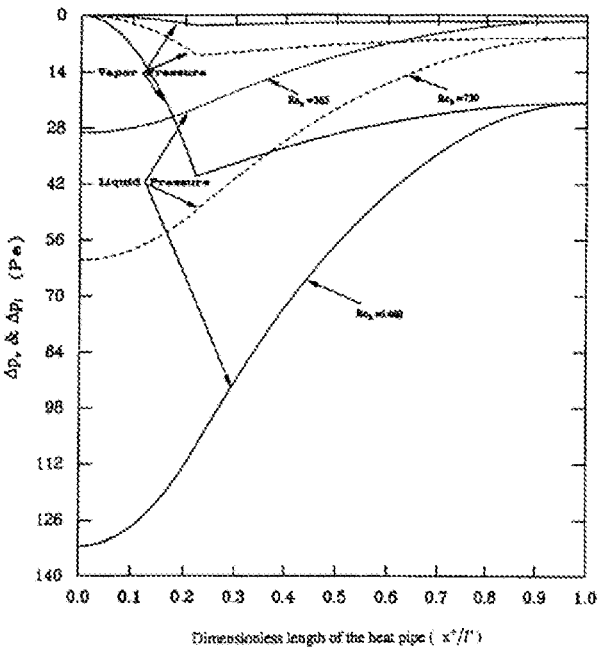
FIG. 7 illustrates a graph depicting data indicative of a comparison of the vapor and liquid pressure distributions along the heat pipe.
Figure 7:
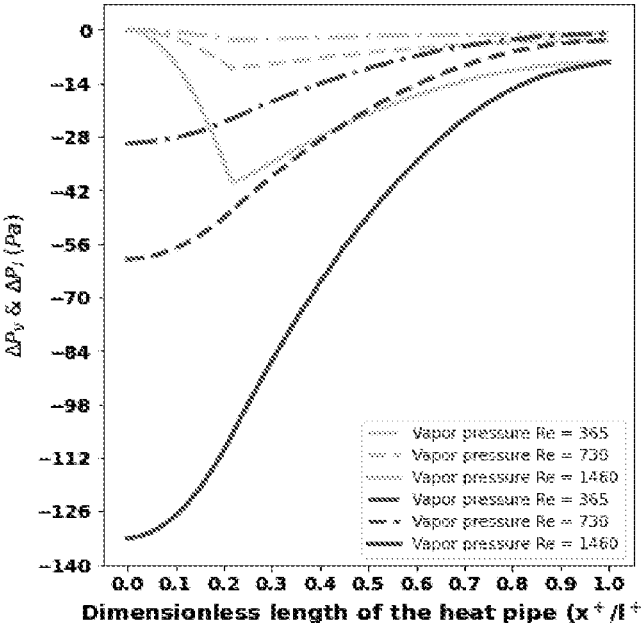
Figure 8:
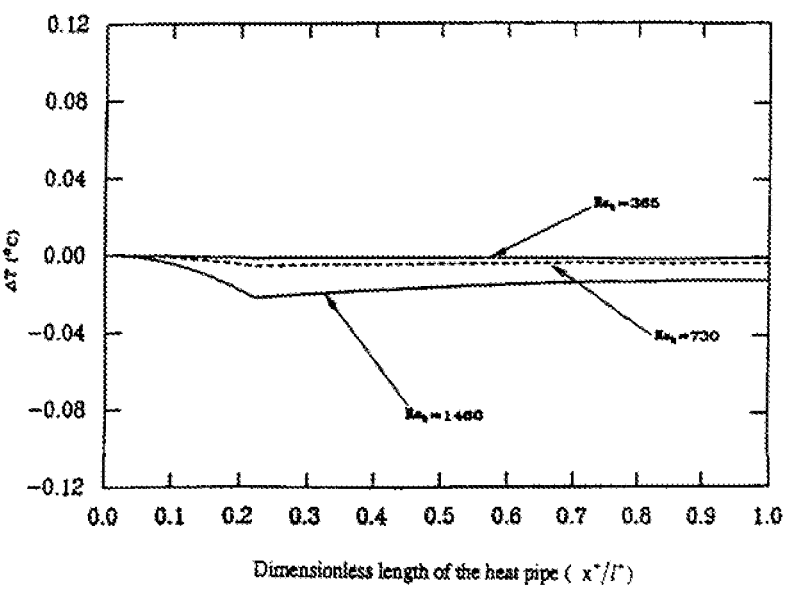
FIG. 8 illustrates a graph depicting data indicative of a comparison of the vapor temperature profiles for different injection Reynolds numbers, in accordance with an embodiment.
Figure 8:
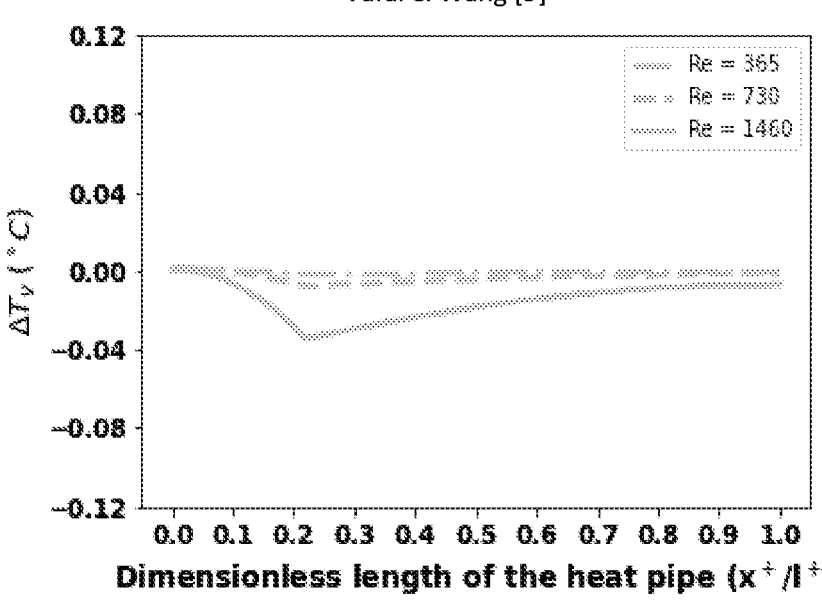

The model is further validated by the experimental results obtained by Zhang et al. [2], where the setup model is similar with our simulation model. Zhang et al. [2] set up the air-cooled 3D IC stack with two layers of stacked processors instead of three for the current simulation model. For the validation purpose, the simulation of two layers of stacked processors are implemented to compare the hotspot temperature in the simulation model with the experimental results. FIG. 6 substantiates the validation of the 3D IC model setup used in the research work. FIG. 7 and FIG. 8 exhibit a comparison of our results for the flat-shaped heat pipes with the comprehensive analytical results acquired by Vafai & Wang [9].

Figure 9:
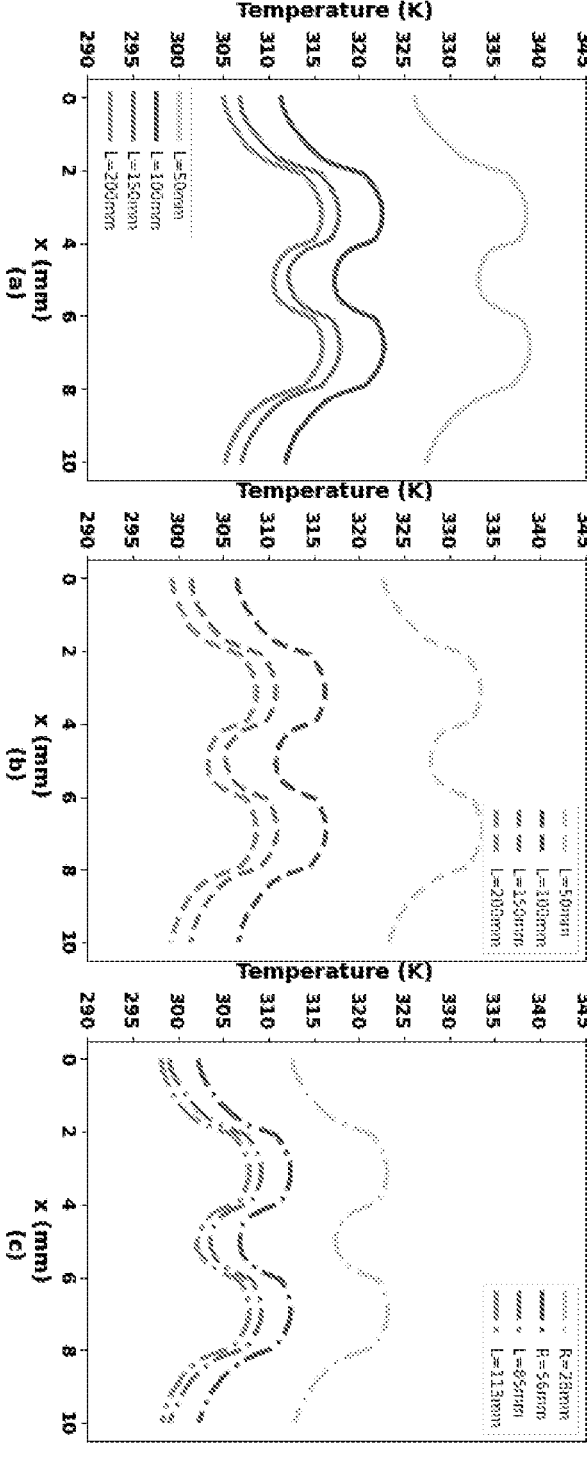
FIG. 9 illustrates a graph depicting data indicative of a Device layer 1 temperature distribution for different lengths of the heat sinks (a) Copper heat sink (b) rectangular-shaped heat pipe (c) disk-shaped heat pipe, in accordance with an embodiment.

The temperature distribution of a 3D IC deploying a copper heat sink, a rectangular-shaped heat pipe and a disk-shaped heat pipe with different heat sink lengths for device layer 1 is investigated. It was concluded in the work of Tavakkoli et al. [4] that the junction temperature is manifested in device layer 1. It should be emphasized that the core-concentrated TSV arrangement is employed throughout the study. The same study from Tavakkoli et al. [4] unveiled that the core-concentrated TSV is superior to the other employments of the optimized TSV arrangement. The current investigation is aimed to optimize the thermal performance based on the foremost employment with the preeminent performance in the previous work. As seen from FIG. 9, as the length of the heat sinks increases, the temperature decreases for all three heat sinks. It is evident that the temperature of the 3D IC drops significantly when the heat sink length increases from 50 mm to 100 mm. The rate of temperature deduction is slower as the length increases further. FIGS. 9(b) and (c) highlights the substantial effect of the rectangular-shaped and disk-shaped heat pipe on the performance of a 3D IC. The rectangular-shaped heat pipe improved the thermal performance by reducing the temperature by 8 degrees in all lengths compared to the copper heat sink. As it was strengthened in Vafai et al. investigations [9-13], the disk-shaped heat pipe showed more advanced performance than the rectangular-shaped heat pipe. With the fixed contact surface area, FIG. 9(*c*) demonstrated a 16 degrees reduction in temperature when the length of the heat sink is 50 mm (R=28 mm for the disk-shaped heat pipe) and an average 10 degrees in other lengths compared to the copper heat sink. These findings reveal that both the rectangular-shaped and disk-shaped heat pipe contribute to the optimization of the thermal performance of the 3D IC by maximizing the heat conduction and minimizing the temperature rise in the 3D ICs.

Figure 10:
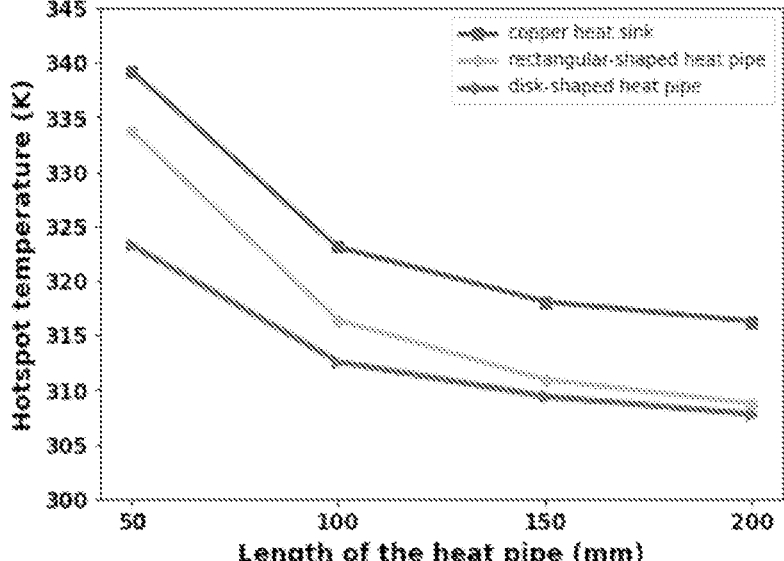
FIG. 10 illustrates a graph depicting data indicative of the effect of the lengths of the heat sink and flat-shaped heat pipes on the hotspot temperature for a nominal 3D IC structure, in accordance with an embodiment.

FIG. 10 further unveils a comparison of different lengths of a flat-shaped heat pipe and a copper heat sink on the hotspot temperature of the 3D IC. The hotspot temperature declines remarkably when the rectangular-shaped heat pipe and disk-shaped heat pipe are implemented in the 3D IC structure. As anticipated, the disk-shaped heat pipe performs superior to rectangular-shaped one at all lengths. There is considerable drop in the hot spot temperature when using a flat shaped heat pipe as compared with a copper heat sink. In addition, as mentioned earlier we also have the advantage of a substantial reduction in the weight when using the flat-shaped heat pipes for the 3D IC set up.

Figure 11:
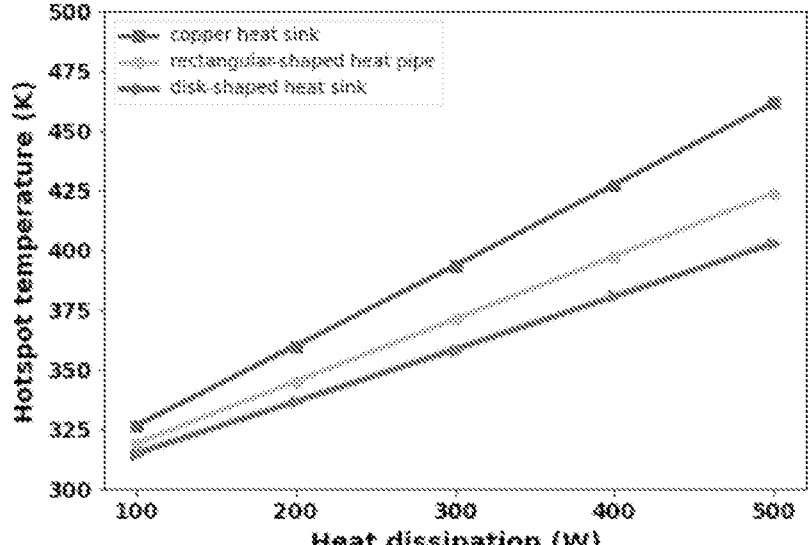
FIG. 11 illustrates a graph depicting data indicative of the effect of the flat-shaped heat pipe on the hotspot temperature of a typical 3D IC for heat dissipation powers, in accordance with an embodiment.

FIG. 11 demonstrates the effect of increasing the heat dissipation on the hotspot temperature of a typical 3D IC utilizing a flat-shaped heat pipe compared with a copper heat sink. The allowed operating temperature for $11^{th}$ Gen Intel Core™ i7 & i9 is 373 K. The 3D IC with a copper heat sink is heated up to 393.45 K at a power of 300 W resulting in the termination of the 3D IC, while the 3D IC with a rectangular flat-shaped heat pipe can operate under 300 W heat dissipation and the one executed with a disk-shaped heat pipe can reach nearly 400 W. These data establish the powerful effect of both the rectangular-shaped and disk-shaped heat pipes on the junction temperature for high-power processors.

Figure 12:
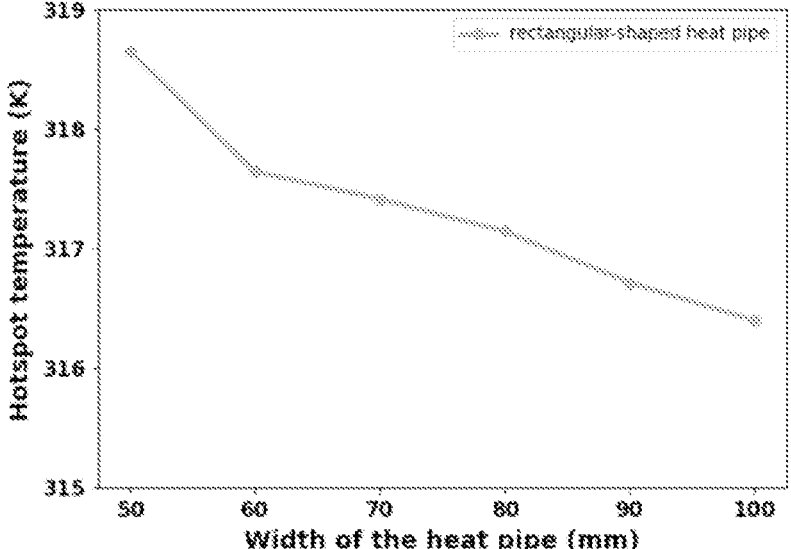
FIG. 12 illustrates a graph depicting data indicative of the effect of different configurations of the rectangular-shaped heat pipe on the hotspot temperature of a typical 3D IC configuration, in accordance with an embodiment.

For a typical fixed contact surface area 10,000 $mm^2$, the hotspot temperature for different configurations of a rectangular-shaped heat pipe is investigated (50×200 $mm^2$, 60×167 $mm^2$, 70×143 $mm^2$, 80×125 $mm^2$, 90×112 $mm^2$, 100×100 $mm^2$). FIG. 12 illustrates a moderate temperature drop of 2 K when using a square shaped flat-shaped heat pipe. That is the square shaped heat pipe (100×100 $mm^2$) carries the premier thermal performance for 3D IC.

Figure 13:
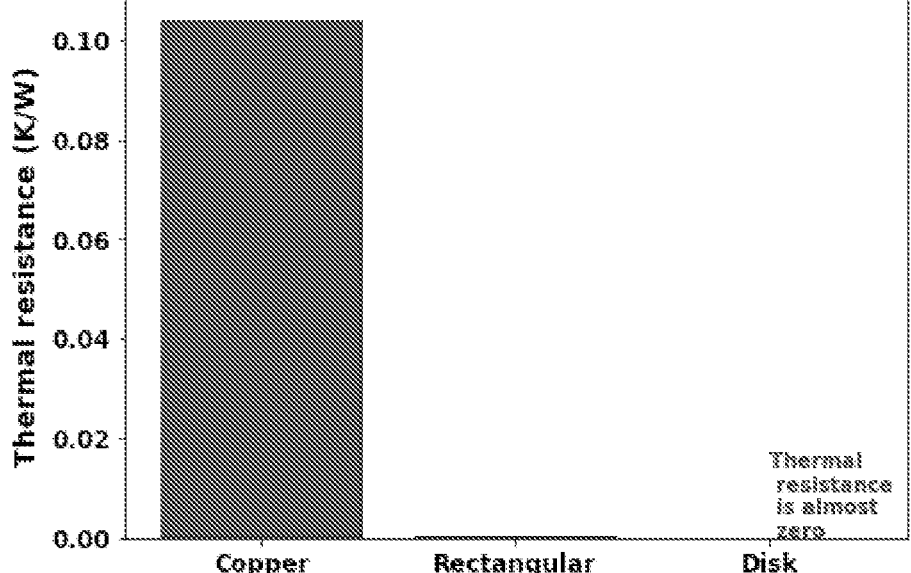
FIG. 13 illustrates a graph depicting data indicative of thermal resistance of different heat sinks implemented in the 3D IC, in accordance with an embodiment.

The thermal resistances of the three different heat sinks are probed. As it can be observed from FIG. 13, the average thermal resistance for the copper heat sink is about 0.104 K/W, while it is 0.0004 K/W for rectangular shaped heat pipe and almost zero for the disk-shaped heat pipe, respectively. These details authenticated the outstanding performance of the flat-shaped heat pipes compared to a copper heat sink.

Figure 14:
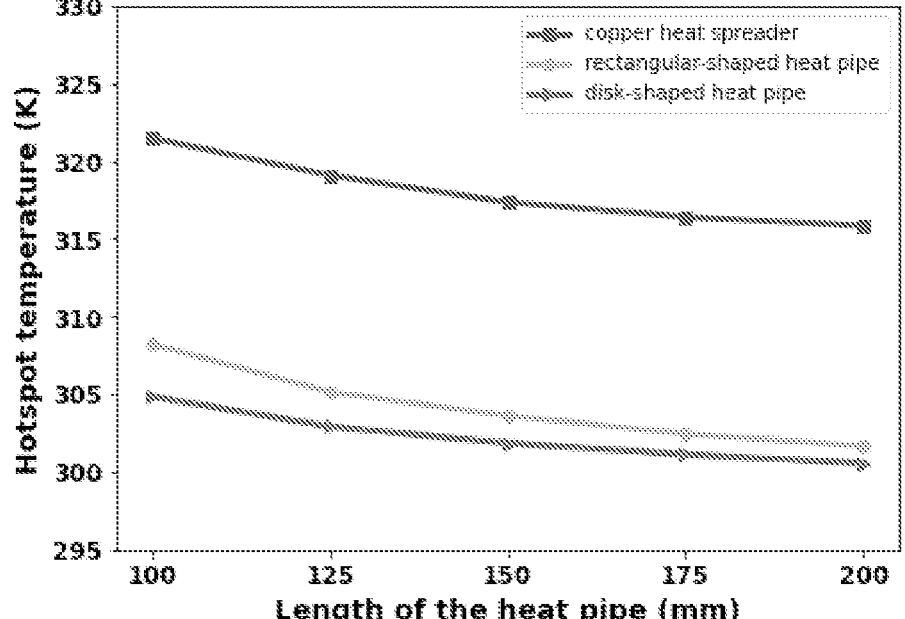
FIG. 14 illustrates a graph depicting data indicative of the effect of a flat-shaped heat pipe as the heat spreader on the hotspot temperature of a 3D IC, in accordance with an embodiment.

FIG. 14 presents the effects of the flat-shaped heat pipe as a heat spreader on the hotspot temperature. The size of the flat-shaped heat pipe as the heat spreader employed in the simulation is 50×50×3 $mm^3$ (R=28 mm for disk-shaped one) with the effective thermal conductivity of 5000 W/m·K. The copper heat sink, rectangular-shaped heat pipe heat sink and disk-shaped heat pipe heat sink are administered on top of the copper heat spreader, rectangular-shaped heat pipe heat spreader and disk-shaped heat pipe heat spreader, respectively. It is seen that using a much lighter weight flat-shaped heat pipe as the heat spreader has a very substantial effect on the hotspot temperature of 3D ICs as opposed to a copper heat spreader of the same size. For a 3D IC with the heat sink length and width 100×100 $mm^2$, the hotspot temperature using the copper heat sink with the copper heat spreader reaches 321.48 K, while the one applying rectangular heat pipes as the heat sink and the heat spreader reduces the hotspot temperature by over 13 K and the one utilizing the disk-shaped heat pipes as the heat sink and the heat spreader further enhances the thermal performance by decreasing the hotspot temperature by almost 17 K.

The optimization and the thermal performance and management of 3D ICs utilizing the innovative rectangular-shaped and disk-shaped heat pipes is investigated in this work. The effects of these innovative flat shaped heat pipes on the temperature distribution and hotspots is explored in detail. All the models investigated in this work were rigorously validated with established analytical and experimental results. The thermal performance and management of the rectangular-shaped and disk-shaped heat pipe as heat sinks and heat spreaders for usage in 3D IC structures were analyzed in detail and their effectiveness were compared with the current use of copper heat sinks and copper heat spreaders. We have established that the flat-shaped heat pipes substantially reduce the temperature distribution and the hotspot temperature. The following conclusions were corroborated in the present work:

Both the rectangular-shaped and disk-shaped heat pipes substantially lower the hotspot temperatures. The rectangular-shaped heat pipe brought down the hotspot temperature by 8° C., the disk-shaped heat pipe can lower it by about 16° C. They offer this sizeable advantage while the 3D IC structure's weight at the same time becomes markedly lighter.

For high-power processors, flat-shaped heat pipes play a vital role in reducing the hotspot temperature. The most prominent solution is to deploy the disk-shaped heat pipe to reduce the hotspot temperature due to the high-power consumption.

The square-shaped heat pipe (100×100 $mm^2$) has the superior thermal performance compared with other rectangular-shaped heat pipe configurations. However, the impact of the change in the configuration from square to rectangular is not that significant.

A copper heat spreader in the 3D IC structure can be replaced by the rectangular-shaped or disk-shaped heat pipe to further optimize the thermal performance. Within the scope of the current study, this replacement reduces the hotspot temperature by 13 K or 17 K, respectively.

It can be appreciated that the embodiments disclosed herein can be implemented in a number of systems and devices, and in the manufacturing of such systems and devices. Examples of systems/devices in which one or more of the embodiments may be implemented include mobile devices and NAND flash memory chips. One example where the disclosed 3D IC (for example, as a 3D IC chip) may find usefulness is in a handheld game console such as the Sony PlayStation Portable (PSB). The Sony PSB can include hardware, for example, such as eDRAM (embedded DRAM) memory in a 3D IC chip (e.g., a 3D system-in-package chip) with two dies stacked vertically. This semi-embedded DRAM arrangement has also been referred to as a 'chip-on-chip' (CoC) solution. Other examples where the embodiments can be implemented include multi-layer 3D IC's, embedded NAND flash memory, and multi-chip package and package on package solutions for NAND flash memory in mobile devices. Other devices in which the embodiments can be implemented include High Bandwidth Memory (HBM) including stacked chips and TSVs.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

NOMENCLATURE

| | |
|---|---|
| $c_p$ | Specific heat at constant pressure [J $(kg \cdot K)^{-1}$] |
| $f(x)$ | Position of the maximum value of vapor velocity in y direction [m] |
| h | Height [m] |
| $h_b^+$ | Dimensionless half width of any of the vapor channels, b/h |
| $h_w$ | Thickness of the wick [m] |
| k | Thermal conductivity [W $(m \cdot K)^{-1}$] |
| K | Permeability [$m^2$] |
| $k_{eff}$ | Effective thermal conductivity [W $(m \cdot K)^{-1}$] |
| l | Length of the heat pipe [m] |
| $L_{eff}$ | Effective length [m] |
| $L_c$ | Characteristic length [m] |
| n | Normal coordinate |
| p | Pressure [Pa] |
| $\Delta p_l$ | Overall liquid pressure drop along the heat pipe [Pa] |
| $\Delta p_v$ | Overall vapor pressure drop along the heat pipe [Pa] |
| $Pe_h$ | Peclet number |
| q | Heat flux [W $\cdot m^{-2}$] |
| $\dot{q}_g$ | Volumetric heat generation rate [W $\cdot m^{-3}$] |
| r | coordinate |
| R | Radius of the disk-shaped heat pipe [m] |
| $Re_h$ | Reynolds number |
| T | Temperature [K] |
| u | x-component of velocity [m $\cdot s^{-1}$] |
| v | y-component of velocity [m $\cdot s^{-1}$] |
| w | z-component of velocity [m $\cdot s^{-1}$] |
| x, y, z | Cartesian coordinates |

Greek symbols

| | |
|---|---|
| $\varphi$ | Ratio of the evaporator length to the heat pipe length |
| $\nu$ | Kinematic viscosity of the vapor [$m^2 \cdot s^{-1}$] |
| $\Theta$ | Dimensionless temperature |
| $\rho$ | Density [kg $\cdot m^{-3}$] |
| $\mu$ | Dynamic viscosity [$(N \cdot s)m^{-2}$] |

Subscripts

| | |
|---|---|
| f | Fluid |
| m | Mean |
| e | Evaporator |
| c | Condenser |
| l | Liquid phase |
| v | Vapor phase |
| w | Wick |
| 0 | Initial |

Superscripts

| | |
|---|---|
| + | Dimensionless quantities |

REFERENCES

[1] Santos, C., Vivet, P., Colonna, J. P., Coudrain, P. and Reis, R., 2014, December. Thermal performance of 3D ICs: Analysis and alternatives. In 2014 *International 3D Systems Integration Conference (3DIC)* (pp. 1-7). IEEE.

[2] Zhang, Y., Dembla, A., Joshi, Y. and Bakir, M. S., 2012, May. 3D stacked microfluidic cooling for high-performance 3D ICs. In 2012 *IEEE 62nd Electronic Components and Technology Conference* (pp. 1644-1650). IEEE.

[3] Chiang, T. Y., Souri, S. J., Chui, C. O. and Saraswat, K. C., 2001, December. Thermal analysis of heterogeneous 3D ICs with various integration scenarios. In *International Electron Devices Meeting. Technical Digest (Cat. No. 01CH37224)* (pp. 31-2). IEEE.

[4] Tavakkoli, F., Ebrahimi, S., Wang, S. and Vafai, K., 2016. Analysis of critical thermal issues in 3D integrated circuits. *International Journal of Heat and Mass Transfer*, 97, pp. 337-352.

[5] Tavakkoli, F., Ebrahimi, S., Wang, S. and Vafai, K., 2016. Thermophysical and geometrical effects on the thermal performance and optimization of a three-dimensional integrated circuit. *Journal of Heat Transfer*, 138(8).

[6] Wang, C., Huang, X. J. and Vafai, K., 2021. Analysis of hotspots and cooling strategy for multilayer three-dimensional integrated circuits. *Applied Thermal Engineering*, 186, p. 116336.

[7] Xiao, C., He, H., Li, J., Cao, S. and Zhu, W., 2017. An effective and efficient numerical method for thermal management in 3D stacked integrated circuits. *Applied Thermal Engineering*, 121, pp. 200-209.

[8] Jain, A., Jones, R. E., Chatterjee, R. and Pozder, S., 2009. Analytical and numerical modeling of the thermal performance of three-dimensional integrated circuits. *IEEE Transactions on Components and Packaging Technologies*, 33(1), pp. 56-63.

[9] Vafai, K. and Wang, W., 1992. Analysis of flow and heat transfer characteristics of an asymmetrical flat plate heat pipe. *International journal of heat and mass transfer*, 35(9), pp. 2087-2099.

[10] Vafai, K., Zhu, N. and Wang, W., 1995. Analysis of asymmetric disk-shaped and flat-plate heat pipes.

[11] Wang, Y. and Vafai, K., 2000. An experimental investigation of the thermal performance of an asymmetrical flat plate heat pipe. *International journal of heat and mass transfer*, 43(15), pp. 2657-2668.

[12] Zhu, N. and Vafai, K., 1998. Vapor and liquid flow in an asymmetrical flat plate heat pipe: a three-dimensional analytical and numerical investigation. *International Journal of Heat and Mass Transfer*, 41(1), pp. 159-174.

[13] Vafai, K. and Zhu, N., 2014. Closure to "Analysis of Asymmetric Disk-Shaped and Flat-Plate Heat Pipes". *Journal of Heat Transfer*, 136(11).

[14] Wang, C., Tang, S., Liu, X., Su, G. H., Tian, W. and Qiu, S., 2020. Experimental study on heat pipe thermoelectric generator for industrial high temperature waste heat recovery. *Applied Thermal Engineering*, 175, p. 115299.

[15] Wan, Q. and Galloway, J., 2011, March. Accurate Theta JC measurement for high power packages. In 2011 *27th Annual IEEE Semiconductor Thermal Measurement and Management Symposium* (pp. 208-215). IEEE.

[16] Bar-Cohen, A., 2009, November. Thermal management of on-chip hot spots and 3D chip stacks. In 2009 *IEEE International Conference on Microwaves, Communications, Antennas and Electronics Systems* (pp. 1-8). IEEE.

[17] Schmidt, R., 2003, January. Challenges in Electronic Cooling: Opportunities for Enhanced Thermal Management Techniques—Microprocessor Liquid Cooled Minichannel Heat Sink. In *International Conference on Nanochannels, Microchannels, and Minichannels* (Vol. 36673, pp. 951-959).

[18] Koo, J. M., Im, S., Jiang, L. and Goodson, K. E., 2005. Integrated microchannel cooling for three-dimensional electronic circuit architectures. *J. Heat Transfer*, 127(1), pp. 49-58.

[19] Lau, J. H. and Yue, T. G., 2009, May. Thermal management of 3D IC integration with TSV (through silicon via). In 2009 *59th Electronic Components and Technology Conference* (pp. 635-640). IEEE.

[20] Sridhar, A., Vincenzi, A., Ruggiero, M., Brunschwiler, T. and Atienza, D., 2010, October. Compact transient thermal model for 3D ICs with liquid cooling via enhanced heat transfer cavity geometries. In 2010 *16th International workshop on thermal investigations of ICs and systems (THERMINIC)* (pp. 1-6). IEEE.

[21] Coskun, A. K., Ayala, J. L., Atienza, D., Rosing, T. S. and Leblebici, Y., 2009, April. Dynamic thermal management in 3D multicore architectures. In 2009 *Design, Automation & Test in Europe Conference & Exhibition* (pp. 1410-1415). IEEE.

[22] Zhou, X., Xu, Y., Du, Y., Zhang, Y. and Yang, J., 2008, September. Thermal management for 3D processors via task scheduling. In 2008 *37th International Conference on Parallel Processing* (pp. 115-122). IEEE.

[23] Xing, X. Q., Lee, Y. J., Tee, T. Y., Zhang, X., Gao, S. and Kwon, W. S., 2011, December. Thermal modeling and characterization of package with through-silicon-vias (TSV) interposer. In 2011 IEEE *13th Electronics Packaging Technology Conference* (pp. 548-553). IEEE.

[24] Lau, J. H., 2012. Recent advances and new trends in nanotechnology and 3D integration for semiconductor industry. *ECS Transactions,* 44(1), p. 805.

What is claimed is:

1. A three-dimensional (3D) integrated circuit device, comprising:
   a thermal interface material layer configured above or from a substrate;
   a plurality of die, a device layer and a micro-bump thermal interface material layer formed above thermal interface material layer;
   a heat spreader located above the plurality of die, the device layer and the thermal interface material, the heat spreader comprising a flat-shaped heat pipe selected from a rectangular-shaped heat pipe and a disk-shaped heat pipe; and
   a heat sink located above the heat spreader, the heat sink selected from the rectangular-shaped heat pipe and the disk-shaped heat pipe, wherein the flat-shaped heat pipe is employed as both the heat spreader and the heat sink to improve a thermal performance of the 3D IC.

2. The 3D integrated circuit device of claim 1, wherein the flat-shaped heat pipe provides an effective thermal conductivity of at least about 5000 W/m·K.

3. The 3D integrated circuit device of claim 1, wherein the flat-shaped heat pipe has a weight that is at least seven times lighter than a copper heat spreader of the same size.

4. The 3D integrated circuit device of claim 1, wherein the 3D integrated circuit device with the flat-shaped heat pipe is operable at power dissipation levels of at least 300 W without exceeding an operating junction temperature of 373 K.

5. The 3D integrated circuit device of claim 1, wherein the plurality of die is interconnected using a core-concentrated TSV arrangement.

6. The 3D integrated circuit device of claim 1, wherein the flat-shaped heat pipe reduces average thermal resistance of the 3D integrated circuit device to about 0.0004 K/W or less.

7. The 3D integrated circuit device of claim 1, wherein the flat-shaped heat pipe is configured to reduce hotspot temperatures for high-power processor applications.

8. The 3D integrated circuit device of claim 1, wherein the 3D integrated circuit device is implemented in a chip-on-chip (CoC) arrangement, a multi-layer 3D IC, a multi-chip package, or a package-on-package configuration.

9. The 3D integrated circuit device of claim 1, wherein:
   the plurality of die is interconnected using a core-concentrated TSV arrangement;
   the flat-shaped heat pipe is configured to reduce hotspot temperatures for high-power processor applications; and the 3D integrated circuit device is implemented in a chip-on-chip (CoC) arrangement, a multi-layer 3D IC, a multi-chip package, or a package-on-package configuration.

10. The 3D integrated circuit device of claim 9, wherein the flat-shaped heat pipe reduces average thermal resistance of the 3D integrated circuit device to about 0.0004 K/W or less.

11. The 3D integrated circuit device of claim 9, wherein the 3D integrated circuit device with the flat-shaped heat pipe is operable at power dissipation levels of at least 300 W without exceeding an operating junction temperature of 373 K.

12. The 3D integrated circuit device of claim 1, wherein the flat-shaped heat pipe is configured to function simultaneously as a heat spreader and a heat sink.

13. The 3D integrated circuit device of claim 1, wherein the flat-shaped heat pipe comprises a wick structure extending across a flat surface of the heat pipe.

14. A three-dimensional (3D) integrated circuit device, comprising:
   a thermal interface material layer configured above or from a substrate;
   a plurality of die, a device layer and a micro-bump thermal interface material layer formed above thermal interface material layer, the plurality of die interconnected using a core-concentrated TSV arrangement;
   a heat spreader located above the plurality of die, the device layer and the thermal interface material, the heat spreader comprising a flat-shaped heat pipe selected from a rectangular-shaped heat pipe and a disk-shaped heat pipe, the flat-shaped heat pipe configured to reduce hotspot temperatures for high-power processor applications; and
   a heat sink located above the heat spreader, the heat sink selected from the rectangular-shaped heat pipe and the disk-shaped heat pipe, wherein the flat-shaped heat pipe is employed as both the heat spreader and the heat sink to improve a thermal performance of the 3D IC.

15. The 3D integrated circuit device of claim 14, wherein the 3D integrated circuit device with the flat-shaped heat pipe is operable at power dissipation levels of at least 300 W without exceeding an operating junction temperature of 373 K.

16. The 3D integrated circuit device of claim 14, wherein the flat-shaped heat pipe is configured to function simultaneously as a heat spreader and a heat sink.

17. The 3D integrated circuit device of claim 14, wherein the flat-shaped heat pipe comprises a wick structure extending across a flat surface of the heat pipe.

18. A method of operating a three-dimensional (3D) integrated circuit device, the method comprising:
   providing a 3D integrated circuit device comprising: a substrate; a thermal interface material (TIM) layer formed above the substrate; a plurality of die and a device layer stacked above the TIM layer and interconnected by micro-bumps; a heat spreader located above the plurality of die and the device layer, the heat spreader comprising a flat-shaped heat pipe selected from a rectangular-shaped heat pipe and a disk-shaped heat pipe; and a heat sink located above the heat spreader, the heat sink comprising a flat-shaped heat pipe selected from the rectangular-shaped heat pipe and the disk-shaped heat pipe;
   providing electrical power to the plurality of die to operate the device layer; and dissipating heat generated by the plurality of die through the TIM layer, the flat-shaped heat pipe heat spreader, and the flat-shaped heat pipe heat sink, thereby reducing hotspot temperatures in the 3D integrated circuit device.

\* \* \* \* \*